(12) United States Patent
Hsiao et al.

(10) Patent No.: US 11,169,212 B2
(45) Date of Patent: Nov. 9, 2021

(54) EXTERNAL BATTERY SHORT-CIRCUIT TESTING DEVICE

(71) Applicant: National Chung-Shan Institute of Science and Technology, Taoyuan (TW)

(72) Inventors: Wei-Min Hsiao, Taoyuan (TW); Shih-Chang Tseng, Taoyuan (TW); Kuo-Kuang Jen, Taoyuan (TW); Gwo-Huei You, Taoyuan (TW); Chih-Hsien Chung, Taoyuan (TW)

(73) Assignee: National Chung-Shan Institute of Science and Technology, Taoyuan (TW)

( * ) Notice: Subject to any disclaimer, the term of this patent is extended or adjusted under 35 U.S.C. 154(b) by 186 days.

(21) Appl. No.: 16/744,109

(22) Filed: Jan. 15, 2020

(65) Prior Publication Data

US 2021/0215761 A1    Jul. 15, 2021

(51) Int. Cl.
*G01R 31/364* (2019.01)
*G01R 31/36* (2020.01)
*H01M 10/42* (2006.01)
*H01M 10/48* (2006.01)

(52) U.S. Cl.
CPC ....... *G01R 31/364* (2019.01); *G01R 31/3644* (2013.01); *H01M 10/425* (2013.01); *H01M 10/4285* (2013.01); *H01M 10/486* (2013.01)

(58) Field of Classification Search
None
See application file for complete search history.

(56) References Cited

U.S. PATENT DOCUMENTS

| | | | | |
|---|---|---|---|---|
| 10,295,606 | B2* | 5/2019 | McCoy | G01R 31/52 |
| 2015/0268285 | A1* | 9/2015 | Loftus | B60L 50/66 |
| | | | | 324/503 |
| 2019/0187213 | A1* | 6/2019 | Wen | H02J 7/0019 |
| 2020/0300921 | A1* | 9/2020 | Chang | G01R 31/3842 |
| 2020/0386823 | A1* | 12/2020 | Lee | G01R 19/16542 |

FOREIGN PATENT DOCUMENTS

| | | |
|---|---|---|
| JP | 10-336876 A | 12/1998 |
| JP | 2015-90745 A | 5/2015 |
| JP | 2015-108605 A | 6/2015 |

* cited by examiner

*Primary Examiner* — Jermele M Hollington
(74) *Attorney, Agent, or Firm* — Winston Hsu

(57) ABSTRACT

The present invention discloses an external battery short-circuit testing device, configured to perform short-circuit test on a battery pack under test. The external battery short-circuit testing device comprises a plurality of fuses; a Hall current transducer, coupled to the plurality of fuses; a current meter, coupled to the Hall current transducer and the battery pack under test; a voltmeter, coupled to the battery pack under test; a variable resistor, coupled to the Hall current transducer; an electromagnetic switch, coupled to the variable resistor and the battery pack under test; and an operation unit, comprising a voltage measurement unit, a current measurement unit, a temperature measurement unit and a switch control unit.

9 Claims, 2 Drawing Sheets

EXTERNAL BATTERY SHORT-CIRCUIT TESTING DEVICE

BACKGROUND OF THE INVENTION

1. Field of the Invention

The present invention relates to a battery testing technology, and more particularly, to an external battery short-circuit testing device.

2. Description of the Prior Art

People are paying more and more attention to issues of environmental sustainability on facing the destruction of the ecological environment and extreme climate changing. It is, thus, expected that electric vehicles, such as electric buses, electric cars, and electric motorcycles, will become popular in the future, wherein the safety of battery modules is a priority issue, especially for the use of passenger cars, which is related to human lives and property and particularly important. To ensure the safety of the battery pack, the R&D personnel have proposed many tests to ensure that the battery is still safe when it is in abuse. In fact, for the risks of the battery pack in practical usage, the test comprises extrusion, puncturing, short-circuit, over-charging, over-discharging, high (low)-temperature testing, and other safety tests. Among these safety test items, the test that simulates the occurrence of internal short-circuit and external short-circuit of the battery is the most common and hard-to-pass safety test. The requirements vary in the condition of the environmental temperature and the external resistance according to different specifications.

All of the safety specifications, such as UL1973, UL2580, UN38.3, ECE R100.02, etc., are required to perform the external short-circuit test to the battery. However, the external short-circuit testing procedure is to directly connect the positive and negative electrodes of the battery, which occurs a large current and generates the large heat to the battery for a short time. In particular, the test for high voltage battery packs may have certain risks, such as flaming, burning and explosion, etc. Yet, the conventional external short-circuit test device for batteries cannot meet the short-circuit test requirements of different standards because the resistance value cannot be adjusted, and the protection mechanism and the stop criterion cannot be set according to the temperature, voltage, current, and other parameters of the battery during the test.

China Patent No. CN206684274 discloses a battery short-circuit test device and battery short-circuit test machine. The battery short-circuit test device includes an AC contactor and a series resistance as the main contact of the AC contactor. However, the battery short-circuit test device has a limit to its size. Therefore, it is necessary to improve the prior art.

SUMMARY OF THE INVENTION

It is therefore a primary objective of the present invention to provide an external battery short-circuit testing device, to improve over disadvantages that the resistance value cannot be adjusted, and the protection mechanism and the stop criterion cannot be set according to the temperature, voltage, current, and other parameters of the battery during the test in the prior art.

The present invention discloses an external battery short-circuit testing device, configured to perform short-circuit test on a battery pack under test, the external battery short-circuit testing device comprising a plurality of fuses; a Hall current transducer, coupled to the plurality of fuses; a current meter, coupled to the Hall current transducer and the battery pack under test; a voltmeter, coupled to the battery pack under test; a variable resistor, coupled to the Hall current transducer; an electromagnetic switch, coupled to the variable resistor and the battery pack under test; and an operation unit, comprising a voltage measurement unit, a current measurement unit, a temperature measurement unit and a switch control unit, wherein the voltage measurement unit is coupled to the voltmeter, the current measurement unit is coupled to the current meter, the temperature measurement unit uses a temperature sensor to measure a temperature of the battery pack under test, and the switch control unit is configured to control remotely the operation of the electromagnetic switch.

In an embodiment of the present invention, a rated current of the fuses is 355 A, and the fuses are in 14 groups.

In an embodiment of the present invention, the variable resistor comprises 5 variable resistances, which are 5 mohm, 10 mohm, 20 mohm, 25 mohm, 100 mohm.

In an embodiment of the present invention, a rated current of the electromagnetic switch is 5000 A.

In an embodiment of the present invention further comprises a short-circuit switch, coupled to the battery pack under test and the operation unit.

In an embodiment of the present invention, a measurable range of voltages measured by the voltage measurement unit is 0-1000V with a 0.1% resolution, a sampling frequency≥100 Hz, and a measuring channel number of 1.

In an embodiment of the present invention, a measurable range of currents measured by the current measurement unit is 0-5000 A with a 0.5% resolution, a sampling frequency≥100 Hz, and a measuring channel number of 1.

In an embodiment of the present invention, a measurable range of temperatures measured by the temperature measurement unit is 0-100° C. with a 0.1° C. resolution, a sampling frequency≥100 Hz, and a measuring channel number of 4.

In an embodiment of the present invention, a testing step thereof comprises:
 (a) connecting the battery pack under test to the external battery short-circuit testing device;
 (b) connecting the voltmeter to the voltage measurement unit, connecting the current meter to the current measurement unit, and connecting the temperature sensor to the battery pack under test;
 (c) setting protected values of voltage, current, temperature, and time in the operation unit;
 (d) starting to perform the short-circuit test;
 (e) capturing voltages, currents, and temperatures of the battery pack under test;
 (f) finishing testing, and determining whether the battery pack under test executes a short-circuit protection mechanism normally or not.

In order to make the objects, technical solutions and advantages of the present invention become more apparent, the following relies on the accompanying drawings and embodiments to describe the present invention in further detail.

These and other objectives of the present invention will no doubt become obvious to those of ordinary skill in the art after reading the following detailed description of the preferred embodiment that is illustrated in the various figures and drawings.

DETAILED DESCRIPTION

The embodiments stated below are utilized for illustrating the concept of the present application. Those skilled in the art can readily understand the advantages and effects of the present invention disclosed by the application.

The battery pack under test of the present invention aims at the high voltage batteries, whose rated voltage is 300V-1200V. The high voltage battery itself comprises a battery management system (BMS) circuit board, and the present invention is provided to test the short-circuit protection mechanism of the battery BMS circuit board.

Figure 1:
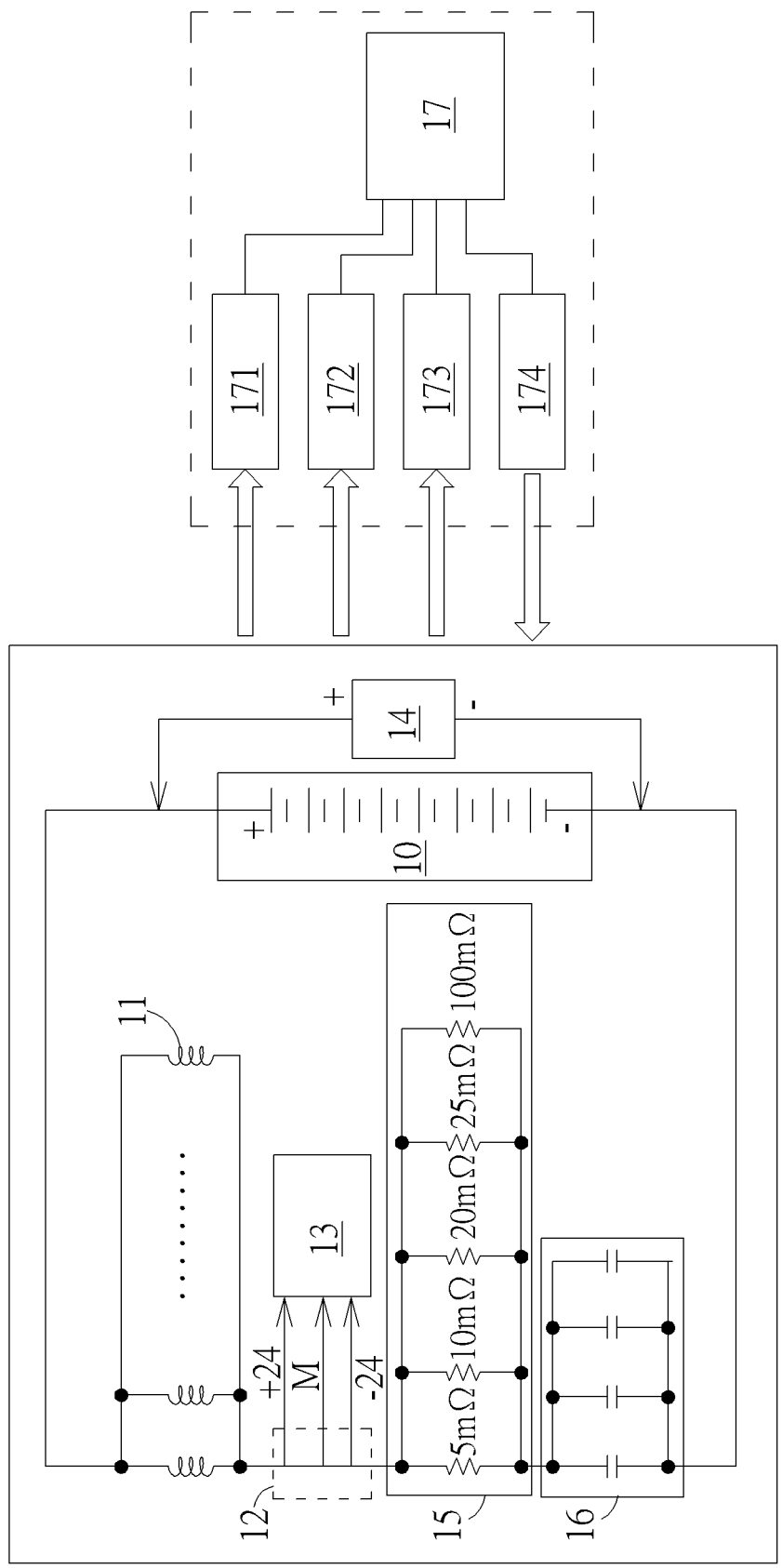
FIG. 1 is an architecture diagram of an external battery short-circuit testing device according to a first embodiment of the present invention.

FIG. 1 is an architecture diagram of an external battery short-circuit testing device according to a first embodiment of the present invention. As shown in FIG. 1, the embodiment comprises fuses 11, whose rated current is 355 A, being in fourteen groups; a Hall current transducer 12, which is coupled to fuses 11; a current meter 13, which is coupled to the Hall current transducer 12 and a battery pack under test 10; a voltmeter 14, which is coupled to the battery pack under test 10; a variable resistor 15, which is coupled to the Hall current transducer 12, wherein the variable resistor 15 is a 5-resistance variable resistor, which has resistances of 5 mohm, 10 mohm, 20 mohm, 25 mohm, 100 mohm; an electromagnetic switch 16, which is coupled to the variable resistor 15 and the battery pack under test 10, wherein the rated current of the electromagnetic switch 16 is 5000 A; and an operation unit 17, which controls the operation of the whole system and records all of the variants of the parameters of the test during the testing. The operation unit 17 comprises a voltage measurement unit 171, a current measurement unit 172, a temperature measurement unit 173, and a switch control unit 174, wherein the voltage measurement unit 171 is coupled to the voltmeter 14, the current measurement unit 172 is coupled to the current meter 13, the temperature measurement unit 173 uses a temperature sensor (not shown in FIG. 1) to measure a temperature of the battery pack under test 10, the switch control unit 174 is configured to remotely control (by digital control and analogy control) the operation of the electromagnetic switch 16.

Figure 2:
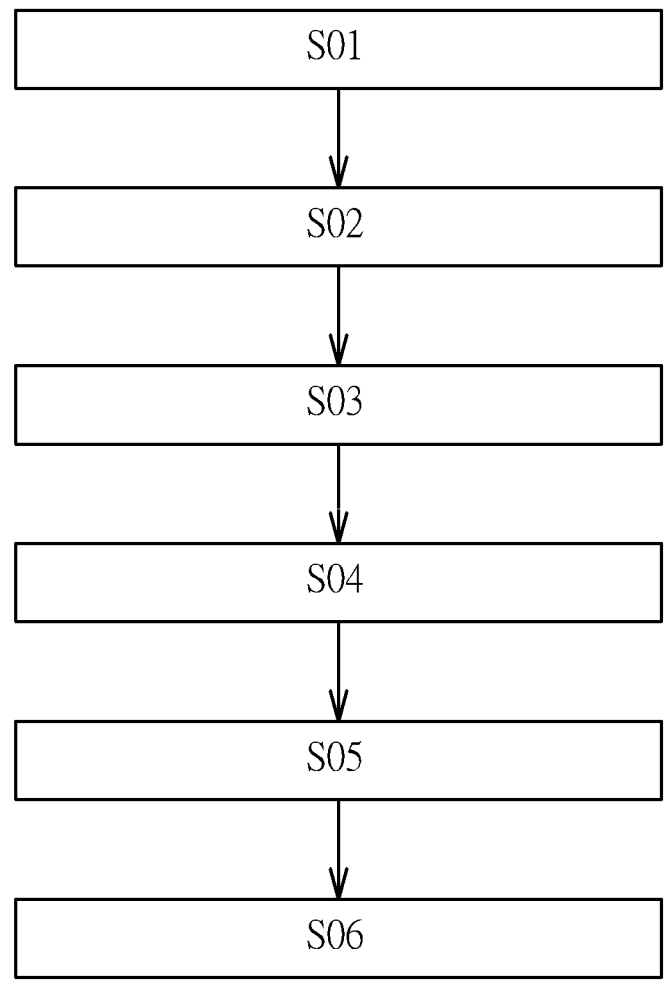
FIG. 2 is a flowchart of a testing steps of an external battery short-circuit testing device according to an embodiment of the present invention.

FIG. 2 is a flowchart of a testing steps of an external battery short-circuit testing device according to an embodiment of the present invention. The testing steps comprise:

Step01: connecting the battery pack under test to the external battery short-circuit testing device.

Step02: connecting the voltmeter to the voltage measurement unit, connecting the current meter to the current measurement unit, and connecting the temperature sensor to the battery pack under test.

Step03: setting protected values of voltage, current, temperature, and time in the operation unit. To prevent the short-circuit protection mechanism of the BMS circuit board of the battery from being broken, causing damage to the battery pack under test or even the test device, the external battery short-circuit testing device of the present invention comprises a short-circuit switch. When the short-circuit protection mechanism of the battery pack under test is out of function, the short-circuit switch may automatically trip according to the pre-set voltage, current, temperature, time, and other protection values.

Step04: starting to perform the short-circuit test.

Step05: capturing voltages, currents, and temperatures of the battery pack under test. The operation unit captures the variants of the parameters such as voltage, current, and temperature of the battery pack under test measured by the voltage measurement unit, current measurement unit, and temperature measurement unit.

Step06: finishing testing, and determining whether the battery pack under test executes a short-circuit protection mechanism normally or not, and generating a test report. If the short-circuit protection mechanism of the battery operates normally, the BMS circuit board of the battery usually automatically trips in several ms to 1 s after the short-circuit test starts, so as to finish the test. Otherwise, if the short-circuit protection mechanism of the BMS circuit board of the battery does not operate, the short-circuit switch of the present invention may automatically trip according to the pre-set protection values to make the loop open and finish the test. Besides, the operation unit records all of the variants of the parameters of the battery pack under test during the testing, and generates a test report.

Therefore, the present invention proposes an external short-circuit testing device, which evaluates whether the short-circuit protection mechanism of the battery pack under test actives normally or not in the circumstance of short-circuit, for a battery to evaluate the safety and reliability of the battery pack to provide the short-circuit protection test verification of high voltage battery, and the present invention proposes a battery short-circuit test device to remotely control electromagnetic switch connectedness with the adjustable connecting time and different resistance values to meet the design requirement according to different specifications test requirements. The present invention may allow the user to perform the external short-circuit testing in many safety specifications such as UL1973, UL2580, UN38.3, ECE R100.02, instantly generate the test complete report of the voltage, current, temperature of the battery under the testing process, determine whether the battery pack passes the safety specification or not, and evaluate the safety and reliability of the battery pack. The size of the battery of the present invention is not limited, and the battery applies to every high voltage battery of electric vehicles with high application flexibility.

The foregoing embodiments are not intended to limit the present application. Those skilled in the art may make modifications and alterations accordingly and not limited herein. Therefore, the scope of the present invention should be as listed in the scope of the claims mentioned below.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An external battery short-circuit testing device, configured to perform short-circuit test on a battery pack under test, the external battery short-circuit testing device comprising:
   a plurality of fuses;
   a Hall current transducer, coupled to the plurality of fuses;
   a current meter, coupled to the Hall current transducer and the battery pack under test;
   a voltmeter, coupled to the battery pack under test;

a variable resistor, coupled to the Hall current transducer;

an electromagnetic switch, coupled to the variable resistor and the battery pack under test; and an operation unit, comprising a voltage measurement unit, a current measurement unit, a temperature measurement unit and a switch control unit, wherein the voltage measurement unit is coupled to the voltmeter, the current measurement unit is coupled to the current meter, the temperature measurement unit uses a temperature sensor to measure a temperature of the battery pack under test, and the switch control unit is configured to control remotely the operation of the electromagnetic switch.

2. The external battery short-circuit testing device of claim 1, wherein a rated current of the fuses is 355 A, and the fuses are in 14 groups.

3. The external battery short-circuit testing device of claim 1, wherein the variable resistor comprises 5 variable resistances, which are 5 mohm, 10 mohm, 20 mohm, 25 mohm, 100 mohm.

4. The external battery short-circuit testing device of claim 1, wherein a rated current of the electromagnetic switch is 5000 A.

5. The external battery short-circuit testing device of claim 1, further comprising: a short-circuit switch, coupled to the battery pack under test and the operation unit.

6. The external battery short-circuit testing device of claim 1, wherein a measurable range of voltages measured by the voltage measurement unit is 0-1000V with a 0.1% resolution, a sampling frequency≥100 Hz, and a measuring channel number of 1.

7. The external battery short-circuit testing device of claim 1, wherein a measurable range of currents measured by the current measurement unit is 0-5000 A with a 0.5% resolution, a sampling frequency≥100 Hz, and a measuring channel number of 1.

8. The external battery short-circuit testing device of claim 1, wherein a measurable range of temperatures measured by the temperature measurement unit is 0-100° C. with a 0.1° C. resolution, a sampling frequency≥100 Hz, and a measuring channel number of 4.

9. The external battery short-circuit testing device of claim 1, wherein a testing step thereof comprises:
(a) connecting the battery pack under test to the external battery short-circuit testing device;
(b) connecting the voltmeter to the voltage measurement unit, connecting the current meter to the current measurement unit, and connecting the temperature sensor to the battery pack under test;
(c) setting protected values of voltage, current, temperature, and time in the operation unit;
(d) starting to perform the short-circuit test;
(e) capturing voltages, currents, and temperatures of the battery pack under test;
(f) finishing testing, and determining whether the battery pack under test executes a short-circuit protection mechanism normally or not.

* * * * *